(12) United States Patent
Nakaoka (10) Patent No.: US 10,891,990 B2
(45) Date of Patent: Jan. 12, 2021

(54) MEMORY DEVICE

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 107 days.

(21) Appl. No.: 16/283,706

(22) Filed: Feb. 22, 2019

(65) Prior Publication Data

US 2020/0105320 A1 Apr. 2, 2020

(30) Foreign Application Priority Data

Sep. 27, 2018 (JP) ................................. 2018-182335

(51) Int. Cl.
*G11C 7/10* (2006.01)
*H03K 19/0185* (2006.01)
*H03F 3/45* (2006.01)

(52) U.S. Cl.
CPC .......... *G11C 7/1096* (2013.01); *G11C 7/1087* (2013.01); *H03K 19/018507* (2013.01); *H03F 3/45179* (2013.01)

(58) Field of Classification Search
CPC .... G11C 7/1084; G11C 7/1087; G11C 7/1096
USPC .................................................. 365/189.17
See application file for complete search history.

(56) References Cited

U.S. PATENT DOCUMENTS

| 9,536,593 | B1 | 1/2017 | Peterson et al. |
| 2004/0218460 | A1* | 11/2004 | Lee ........................ G11C 7/1078 |
| | | | 365/233.1 |
| 2005/0212788 | A1* | 9/2005 | Fukuda .................... G09G 3/20 |
| | | | 345/204 |
| 2007/0001740 | A1* | 1/2007 | Lin .................. H03K 3/356113 |
| | | | 327/333 |

(Continued)

FOREIGN PATENT DOCUMENTS

| CN | 106328186 | 1/2017 |
| EP | 2457323 | 5/2015 |

(Continued)

OTHER PUBLICATIONS

"Office Action of Taiwan Counterpart Application," dated May 14, 2019, p. 1-p. 5.

(Continued)

*Primary Examiner* — Hoai V Ho
(74) *Attorney, Agent, or Firm* — JCIPRNET (57) ABSTRACT

A memory device includes a data receiver, a latch driver, and a voltage level shifter. The data receiver works in a first voltage, receives an enable signal, a reference signal, and an input data signal, and outputs an internal data signal by the first voltage. The latch driver receives a write select signal and the internal data signal, latches the internal data signal by the first voltage, and outputs at least one latch data signal by a second voltage. The voltage level shifter receives the at least one latch data signal by the second voltage and generates at least one output data signal by the at least one latch data signal. The voltage level shifter sets a voltage value of the at least one output data signal by the first voltage. The voltage value of the first voltage is greater than the voltage value of the second voltage.

16 Claims, 5 Drawing Sheets

(56) References Cited

U.S. PATENT DOCUMENTS

| | | | |
|---|---|---|---|
| 2008/0186266 A1* | 8/2008 | Takahashi | G09G 3/3688 345/87 |
| 2011/0018606 A1* | 1/2011 | Cassia | H03K 19/018528 327/333 |
| 2016/0035413 A1* | 2/2016 | Kim | G11C 11/419 365/72 |
| 2016/0182053 A1* | 6/2016 | Aipperspach | H03K 19/018521 326/81 |

FOREIGN PATENT DOCUMENTS

| | | |
|---|---|---|
| JP | H018656 | 1/1989 |
| JP | H1116346 | 1/1999 |
| JP | H1116353 | 1/1999 |
| JP | 2006018984 | 1/2006 |
| JP | 2012114837 | 6/2012 |
| JP | 2015012351 | 1/2015 |
| TW | 201342390 | 10/2013 |
| TW | I608493 | 12/2017 |

OTHER PUBLICATIONS

"Office Action of Japan Counterpart Application", dated Aug. 27, 2019, p. 1-p. 6.

\* cited by examiner

MEMORY DEVICE

CROSS-REFERENCE TO RELATED APPLICATION

This application claims the priority benefit of Japan application serial no. 2018-182335, filed on Sep. 27, 2018. The entirety of the above-mentioned patent application is hereby incorporated by reference herein and made a part of this specification.

BACKGROUND

Technical Field

The disclosure relates to a memory device. More particularly, the disclosure relates to a memory device capable of increasing an operating speed and lowering power consumption.

Description of Related Art

In a conventional standard semiconductor memory device featuring the low power double data rate 4X(LPDDR4X), in order to lower power consumption, the data receiver in the memory device is designed to have a lower operating voltage (e.g., 0.6 volt), and peripheral circuits of the memory device are designed to have higher operating voltages (e.g., 1.1 volts).

Nevertheless, when the data receiver of the memory device is driven by a lower operating voltage, a decrease in speed of the memory device may occur owing to excessively low voltage. Besides, all of the peripheral circuits of the memory device are driven by higher operating voltages, hence the effect of power consumption reduction of the memory device may not be significant. Therefore, design of the data receiver and the peripheral circuits in the memory device is an important issue.

SUMMARY

The disclosure provides a memory device in which a data receiver and other peripheral circuits are driven by operating voltages of different voltage values so as to increase an operating speed of the memory device and lower power consumption of the memory device.

A memory device provided by an embodiment of the disclosure includes a data receiver, a latch driver, and a voltage level shifter. The data receiver works in a first voltage, is configured to receive an enable signal, a reference signal, and an input data signal, and outputs an internal data signal by the first voltage. The latch driver is coupled to the data receiver, is configured to receive a write select signal and the internal data signal, latches the internal data signal by the first voltage, and outputs at least one latch data signal by a second voltage. The voltage level shifter is coupled to the latch driver, receives the at least one latch data signal by the second voltage, and generates at least one output data signal by the at least one latch data signal. The voltage level shifter sets a voltage value of the at least one output data signal by the first voltage. The voltage value of the first voltage is greater than the voltage value of the second voltage.

To sum up, in the disclosure, the first voltage having a greater voltage value is used to drive the data receiver. The latch driver and the voltage level shifter are driven based on levels, and the latch driver is driven by the first voltage to latch the internal data signal. The latch driver is then driven by the second voltage having a lower voltage value to output the at least one latch data signal. Next, the second voltage is used to drive the voltage level shifter to receive the at least one latch data signal, and the first voltage is then used to drive the voltage level shifter to output the voltage value of the at least one output data signal. In this way, the operating speed of the memory device is increased, and power consumption of the memory device is lowered.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
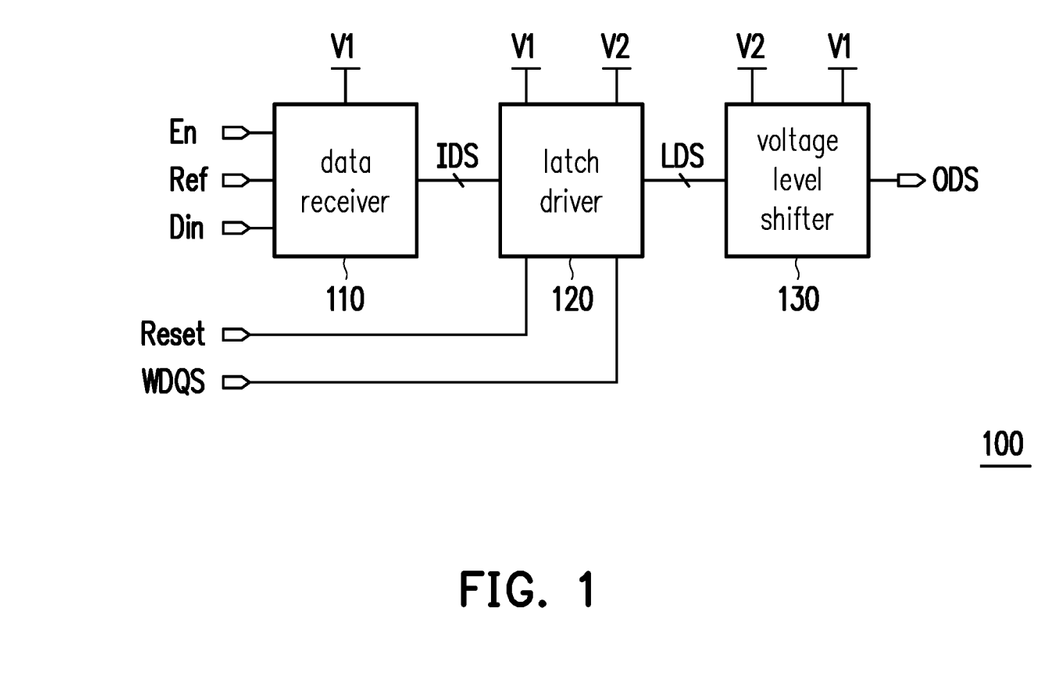
FIG. 1 is a schematic diagram illustrating circuit blocks of a memory device according to an embodiment of the disclosure.

With reference to FIG. 1, FIG. 1 is a schematic diagram illustrating circuit blocks of a memory device according to an embodiment of the disclosure. A memory device 100 includes a data receiver 110, a latch driver 120, and a voltage level shifter 130. The data receiver 110 works in a first voltage V1, receives an enable signal En, a reference signal Ref, and an input data signal Din, and the data receiver 110 outputs an internal data signal IDS to the latch driver 120 by the first voltage V1. The latch driver 120 is coupled to the data receiver 110, works in the first voltage V1 and a second voltage V2, and receives a reset signal Reset, a write select signal WDQS, and the internal data signal IDS from the data receiver 110. Herein, the latch driver 120 may perform a reset operation by the reset signal Reset and may perform a writing operation by the write select signal WDQS.

Next, the latch driver 120 latches the internal data signal IDS by the first voltage V1 and outputs at least one latch data signal (e.g., a latch data signal LDS) to the voltage level shifter 130 by the second voltage V2 after latching the internal data signal IDS. Note that in order to simplify the description, only one latch data signal LDS is schematically depicted in this embodiment as an exemplary example; nevertheless, people having ordinary skill in the art may adjust the number of the latch data signal according to needs during actual applications, and the disclosure is not intended to limit the number of the latch data signal.

The voltage level shifter 130 is coupled to the latch driver 120, works in the first voltage V1 and the second voltage V2, receives the latch data signal LDS by the second voltage V2, and generates at least one output data signal (e.g., an output data signal ODS) by the latch data signal LDS. The voltage level shifter 130 sets a voltage value of the output data signal ODS by the first voltage. Note that in order to simplify the description, only one output data signal ODS is schematically depicted in this embodiment as an exemplary example as well; nevertheless, the disclosure is not intended to limit the number of the output data signal.

It is worth mentioning that in this embodiment, the voltage value of the first voltage V1 is greater than the voltage value of the second voltage V2. That is, the first voltage V1 and the second voltage V2 having different voltage values are used in this embodiment to individually drive the data receiver 110, the latch driver 120, and the voltage level shifter 130 to perform multiple actions. In this way, the data receiver 110 works in the first voltage V1 having a greater voltage value, so that an operating speed of the memory device 100 is increased. In addition, the latch driver 120 and the voltage level shifter 130 are driven based on levels, so the latch driver 120 is driven by the first voltage V1 having a greater voltage, so as to accordingly receive and latch the internal data signal IDS. The latch driver 120 is driven by the second voltage V2 having a lower voltage value so as to output the latch data signal LDS, and the voltage level shifter 130 is then driven by the second voltage V2 having a lower voltage value so as to receive the latch data signal LDS. The voltage level shifter 130 is driven by the first voltage V1 having a greater voltage value to set the output data signal ODS, so as to accordingly lower power consumption of the memory device 100.

Figure 2:
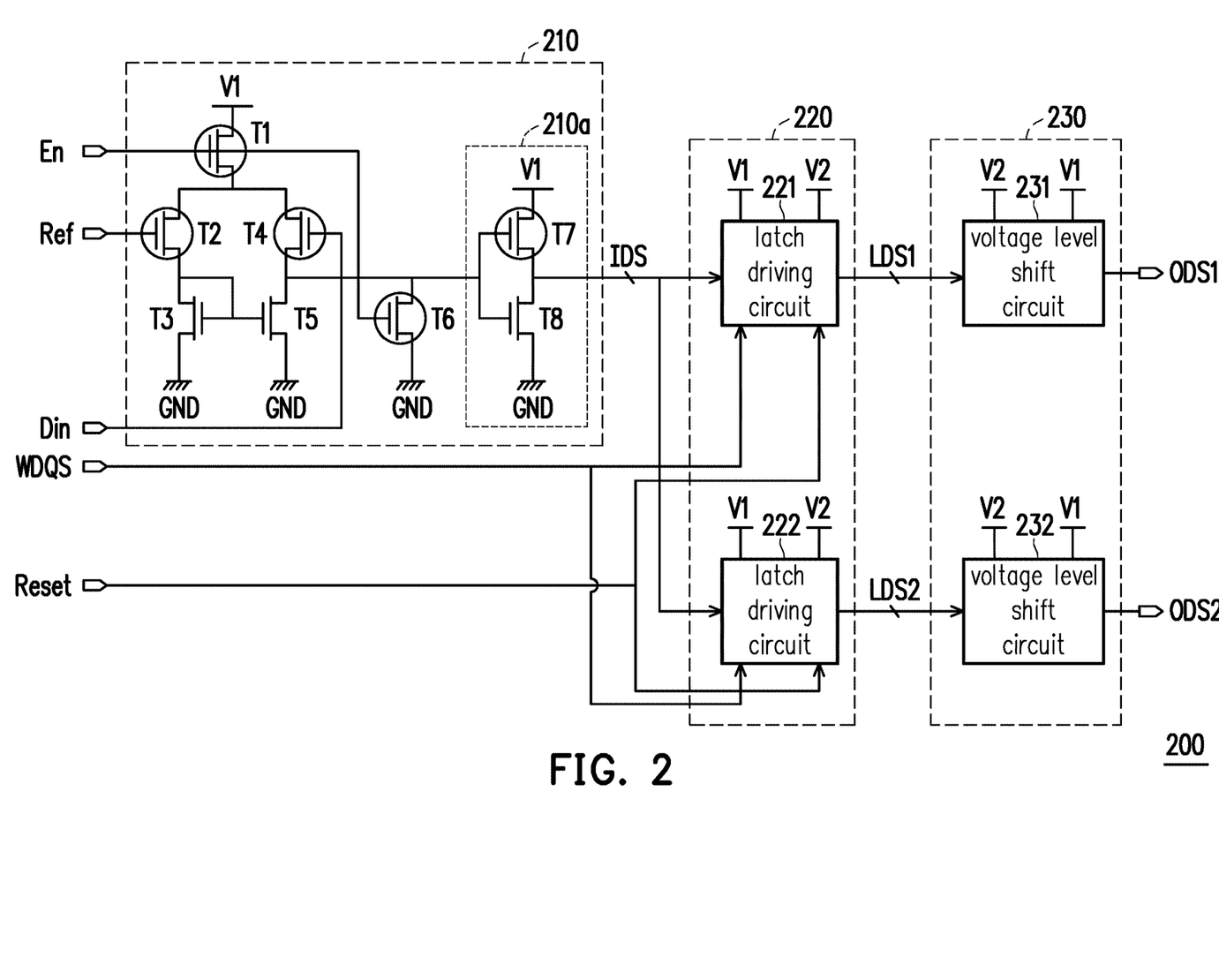
FIG. 2 is a schematic diagram illustrating circuit blocks of a memory device according to another embodiment of the disclosure.

With reference to FIG. 2, FIG. 2 is a schematic diagram illustrating circuit blocks of a memory device according to another embodiment of the disclosure. A memory device 200 includes a data receiver 210, a latch driver 220, and a voltage level shifter 230. The data receiver 210 works in the first voltage V1, receives the enable signal En, the reference signal Ref, and the input data signal Din, and outputs the internal data signal IDS by the first voltage V1. To be specific, the data receiver 210 includes transistors T1 to T6 and an inverting circuit 210a. A first terminal of the transistor T1 receives the first voltage V1, a control terminal of the transistor T1 receives the enable signal En, and a second terminal of the transistor T1 is coupled to a first terminal of the transistor T2. The first terminal of the transistor T2 is coupled to the second terminal of the transistor T1, a control terminal of the second transistor T2 receives the reference signal Ref, and a second terminal of the transistor T2 is coupled to a first terminal of the transistor T3. The first terminal of the transistor T3 is coupled to the second terminal of the transistor T2, a control terminal and the first terminal of the transistor T3 are coupled to each other, and a second terminal of the transistor T3 receives a grounding voltage GND.

A first terminal of the transistor T4 is coupled to the second terminal of the transistor T1, a control terminal of the transistor T4 receives the input data signal Din, and a second terminal of the transistor T4 is coupled to a first terminal of the transistor T5. The first terminal of the transistor T5 is coupled to the second terminal of the transistor T4, a control terminal of the transistor T5 is coupled to the control terminal of the transistor T3, and a second terminal of the transistor T5 receives the grounding voltage GND. Herein, the transistor T1 may form a current source, the transistor T2 and the transistor T4 may form a differential pair, and the transistor T3 and the transistor T5 may form an active load. That is, the transistors T1 to T5 may form a differential amplifier in this embodiment. A first terminal of the transistor T6 is coupled to the first terminal of the transistor T5, a control terminal of the transistor T6 receives the enable signal En, and a second terminal of the transistor T6 receives the grounding voltage GND. The inverting circuit 210a is coupled to the first terminal of the transistor T6 and is configured to output the internal data signal IDS.

Further, transistors T7 to T8 are included in the inverting circuit 210a. A first terminal of the transistor T7 receives the first voltage V1, a control terminal of the transistor T7 is coupled to the first terminal of the transistor T6, and a second terminal of the transistor T7 outputs the internal data signal IDS. A first terminal of the transistor T8 is coupled to the second terminal of the transistor T7, a control terminal of the transistor T8 is coupled to the control terminal of the transistor T7, and a second terminal of the transistor T8 receives the grounding voltage GND.

It is worth mentioning that the inverting circuit 210a of this embodiment may be accordingly implemented based on the inverting circuit structure of other memory devices known to people having ordinary skill in the art, which is not particularly limited by the disclosure.

In addition, the latch driver 220 includes a first latch driving circuit 221 and a second latch driving circuit 222. The first latch driving circuit 221 is coupled to the data receiver 210, works in the first voltage V1 and the second voltage V2, receives the reset signal Reset, the write select signal WDQS, and the internal data signal IDS, latches the internal data signal IDS from the data receiver 210 by the first voltage V1, and outputs one latch data signal (e.g., a first latch data signal LDS1) in the at least one latch data signal by the second voltage V2. The second latch driving circuit 222 is coupled to the data receiver 210 as well, also works in the first voltage V1 and the second voltage V2, receives the reset signal Reset, the write select signal WDQS, and the internal data signal IDS to latch the internal data signal IDS from the data receiver 210 by the first voltage V1, and outputs one latch data signal (e.g., a second latch data signal LDS2) in the at least one latch data signal by the second voltage V2. The first latch driving circuit 221 and the second latch driving circuit 222 perform the reset operation by the reset signal Reset. In addition, the first latch driving circuit 221 and the second latch driving circuit 222 individually perform the writing operation by the write select signal WDQS. Herein, the write select signal WDQS received by the first latch driving circuit 221 and the write select signal WDQS received by the second latch driving circuit 222 are inverted.

In addition, the disclosure also mentions that the first latch data signal LDS1 is, for example, an odd channel signal, and the second latch data signal LDS2 is, for example, an even channel signal in this embodiment. In this way, the memory device may transmit data when a clock signal goes high and low through preparing two paths including an odd channel and an even channel in the memory device. That is, data transmission may be performed twice in a clock signal cycle, and that the operating speed of the memory device is increased.

From another perspective, the voltage level shifter 230 includes a first voltage level shift circuit 231 and a second voltage level shift circuit 232. The first voltage level shift circuit 231 is coupled to the first latch driving circuit 221, works in the first voltage V1 and the second voltage V2, receives the first latch data signal LDS1 by the second voltage V2, and generates one output data signal (e.g., a first output data signal ODS1) in the at least one output data signal by the first latch data signal LDS1. Herein, the first voltage level shift circuit 231 sets the voltage value of the first output data signal ODS1 by the first voltage V1. In contrast, the second voltage level shift circuit 232 is coupled to the second latch driving circuit 222, receives the second latch data signal LDS2 by the second voltage V2, and generates one output data signal (e.g., a second latch data signal ODS2) in the at least one output data signal by the second latch data signal LDS2. Herein, the voltage value of the second output data signal ODS2 is set by the second voltage level shift circuit 232 by the first voltage V1.

Figure 3:
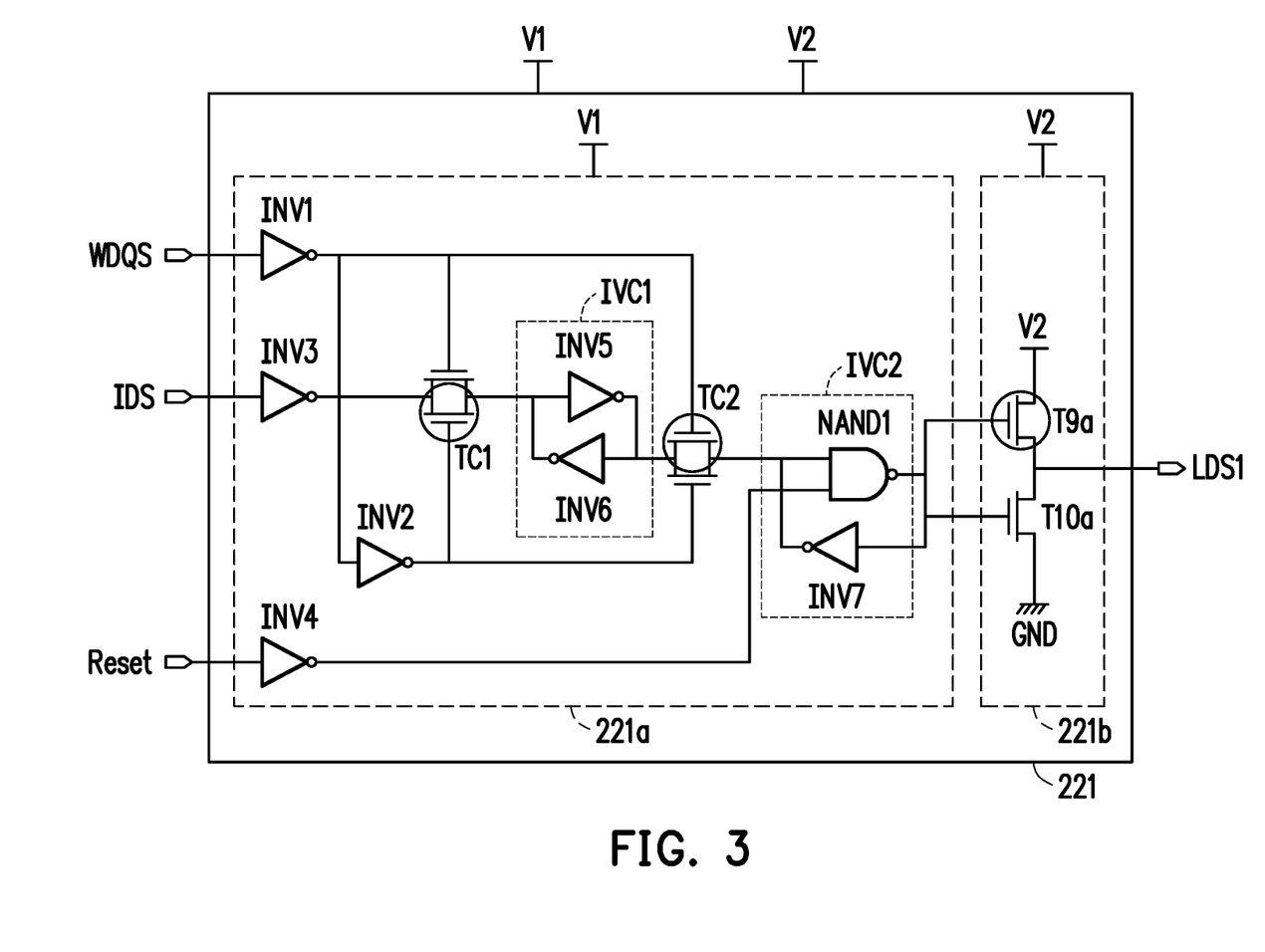
FIG. 3 is a schematic diagram illustrating an internal circuit structure of the latch driving circuit of FIG. 2 according to an embodiment of the disclosure.

Next, internal circuit structures of the first latch driving circuit 221 and the second latch driving circuit 222 are described in detail as follows. For ease of description, only the internal circuit structure of the first latch driving circuit 221 is depicted, and the first latch driving circuit 221 is served as an exemplary example for illustration. With reference to FIG. 2 and FIG. 3 together, FIG. 3 is a schematic diagram illustrating an internal circuit structure of the latch driving circuit of FIG. 2 according to an embodiment of the disclosure. The first latch driving circuit 221 includes a latch circuit 221*a* and a driving circuit 221*b*. The latch circuit 221*a* is coupled to the data receiver 210, is configured to receive the reset signal Reset, the write select signal WDQS, and the internal data signal IDS, and latches the internal data signal IDS by the first voltage V1. The driving circuit 221*b* is coupled to the latch circuit 221*a* and outputs the first latch data signal LDS1 by the second voltage V2.

Further, the latch circuit 221*a* includes inverters INV1, INV2, INV3 and INV4, transfer gates TC1 and TC2, and latches IVC1 and IVC2. An input terminal of the inverter INV1 receives the write select signal WDQS, an output terminal of the inverter INV1 is coupled to an input terminal of the inverter INV2, and outputs an inverted write select signal. The input terminal of the inverter INV2 is coupled to the output terminal of the inverter INV1, and an output terminal of the inverter INV2 is coupled to a P channel control terminal of the transfer gate TC1. An input terminal of the inverter INV3 receives the internal data signal IDS, an output terminal of the inverter INV3 is coupled to an input terminal of the transfer gate TC1, and outputs an inverted internal data signal. An N channel control terminal of the transfer gate TC1 is coupled to the output terminal of the inverter INV1, the P channel control terminal of the transfer gate TC1 is coupled to the output terminal of the inverter INV2, an input terminal of the transfer gate TC1 is coupled to the output terminal of the inverter INV3, and an output terminal of the transfer gate TC1 is coupled to an input terminal of the latch IVC1. Herein, the transfer gate TC1 receives the inverted internal data signal and is controlled by the inverted write select signal to be turned on or turned off.

The input terminal of the latch IVC1 is coupled to the output terminal of the transfer gate TC1, and an output terminal of the latch IVC1 is coupled to an input terminal of the transfer gate TC2 to be configured to latch the inverted internal data signal. A P channel control terminal of the transfer gate TC2 is coupled to the output terminal of the inverter INV1, an N channel control terminal of the transfer gate TC2 is coupled to the output terminal of the inverter INV2, the input terminal of the transfer gate TC2 is coupled to the output terminal of the latch IVC1, and an output terminal of the transfer gate TC2 is coupled to a first input terminal of the latch IVC2. Herein, the transfer gate TC2 receives a signal in the latch IVC1 and is controlled by the inverted write select signal to be turned on or turned off. An input terminal of the inverter INV4 receives the reset signal Reset to output the inverted reset signal, and an output terminal of the inverter INV4 is coupled to a second input terminal of the latch IVC2. The first input terminal of the latch IVC2 is coupled to the output terminal of the transfer gate TC2, the output terminal of the latch IVC2 is coupled to the driving circuit 221*b*, and the latch IVC2 latches the signal from the latch IVC1 and the inverted reset signal.

Motions of the elements in the latch circuit 221*a* are described in detail as follows. In the latch circuit 221*a*, the inverter INV3 receives the internal data signal IDS to generate the inverted internal data signal, and the inverter INV4 receives the reset signal Reset to generate the inverted reset signal. When the write select signal WDQS is at the logic low level (e.g., 0), the inverter INV1 receives the write select signal WDQS to generate the inverted write select signal of the logic high level (e.g., 1). At this time, the transfer gate TC1 is controlled by the inverted write select signal at the logic high level and is turned on, and receives and transfers the inverted internal data signal to the latch IVC1 for latching. At this time, the transfer gate TC2 is controlled by the inverted write select signal to be turned off.

Next, when the write select signal WDQS transits to the logic high level (i.e., 1), the inverted write select signal transits to the logic low level (i.e., 0). At this time, the transfer gate TC1 is controlled by the inverted write select signal of the logic low level and is turned off, and the transfer gate TC2 is controlled by the inverted write select signal of the logic low level and is turned on, so as to receive and transfer data in the latch IVC1 to the latch IVC2. In this way, the latch IVC2 latches data in the latch IVC1 and the inverted reset signal to output an inverted first latch data signal to the driving circuit 221*b*.

In addition, the disclosure also mentions that inverters INV5 and INV6 are included in the latch IVC1. An input terminal of the inverter INV5 is coupled to the output terminal of the transfer gate TC1, and an output terminal of the inverter INV5 is coupled to the input terminal of the transfer gate TC2. An input terminal of the inverter INV6 is coupled to the output terminal of the inverter INV5, and an output terminal of the inverter INV6 is coupled to the input terminal of the inverter INV5. The latch IVC2 includes an inverter INV7 and a NAND gate NAND1. A first terminal of the NAND gate NAND1 is coupled to the output terminal of the transfer gate TC2, a second terminal of the NAND gate NAND1 is coupled to the output terminal of the inverter INV4, an output terminal of the NAND gate NAND1 and the input terminal of the inverter INV7 are coupled to each other, and the output terminal of the inverter INV7 is coupled to the first terminal of the NAND gate NAND1.

From another perspective, the driving circuit 221*b* includes transistors T9*a* and T10*a*. A first terminal of the transistor T9*a* receives the second voltage V2, a control terminal of the transistor T9*a* is coupled to the output terminal of the latch IVC2 in the latch circuit 221*a*, and a second terminal of the transistor T9*a* outputs the first latch data signal LDS1. A first terminal of the transistor T10*a* is coupled to the second terminal of the transistor T9*a*, a control terminal of the transistor T10*a* is coupled to the output terminal of the latch IVC2 in the latch circuit 221*a* as well, and a second terminal of the transistor T10*a* receives the grounding voltage GND. In this way, after receiving the inverted first latch data signal, the driving circuit 221*b* outputs the first latch data signal LDS1 by the second voltage V2. Herein, in this embodiment, the transistor T9*a* of the driving circuit 221*b* is a P-type transistor, and the transistor T10*a* is an N-type transistor. Besides, in this embodiment, the internal circuit structure and motions of the elements of the second latch driving circuit 222 are similar to that of the first latch driving circuit 221. Hence, people having ordinary skill in the art may implement the internal circuit structure of the second latch driving circuit 222 of this embodiment according to description of the implementation related to the first latch driving circuit 221, and repeated description is not provided herein.

Figure 4:
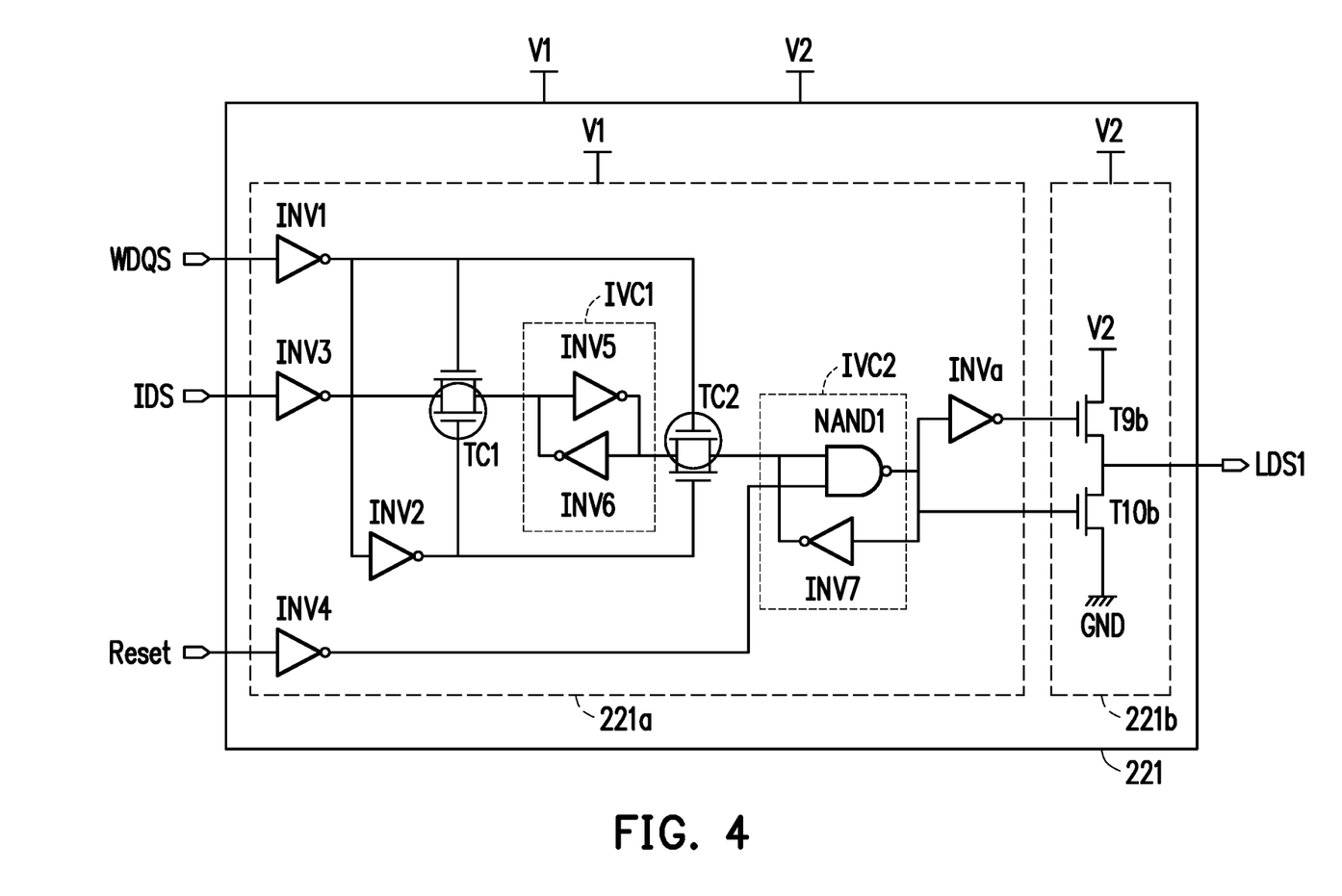
FIG. 4 is a schematic diagram illustrating an internal circuit structure of the latch driving circuit of FIG. 2 according to another embodiment of the disclosure.

It is worth mentioning that with reference to FIG. 2 and FIG. 4 together, FIG. 4 is a schematic diagram illustrating an internal circuit structure of the latch driving circuit of FIG. 2 according to another embodiment of the disclosure. The difference between the embodiment of FIG. 3 and this embodiment is that the latch circuit 221a of this embodiment further includes an inverter INVa, and a transistor T9b and a transistor T10b in the driving circuit 221b of this embodiment are both N-type transistors. To be specific, an input terminal of the inverter INVa is coupled to the output terminal of the latch IVC2, and an output terminal of the inverter INVa is coupled to a control terminal of the transistor T9b in the driving circuit 221b. Herein, the inverter INVa receives the inverted first latch data signal from the latch IVC2 to transfer the first latch data signal LDS1 to the control terminal of the transistor T9b. In this way, in the driving circuit 221b of this embodiment, a driving capability of the driving circuit 221b may be enhanced and the operating speed may be increased through using the transistors T9b and T10b of the N-type transistors. In addition, in the transistor T9b in the driving circuit 221b, the maximum voltage value of the first latch data signal LDS1 of the driving circuit 221b may be substantially equal to the voltage value of the second voltage V2 minus the voltage value of a threshold voltage of the transistor T9b as affected by the body effect. In this way, electricity is saved and power consumption is lowered. In contrast, in this embodiment, the latch circuit of the second latch driving circuit 222 may include the inverter INVa as well, and the transistors in the driving circuit may all be replaced by N-type transistors. People having ordinary skill in the art may implement the internal circuit structure of the second latch driving circuit 222 of this embodiment according to description of the implementation related to the latch circuit 221a and the driving circuit 221b, and repeated description is not provided herein.

Besides, the rest of the circuit structures and motions of the latch circuit 221a and the driving circuit 221b of this embodiment are similar to that of the embodiment of FIG. 3, and repeated description is not provided herein.

Figure 5:
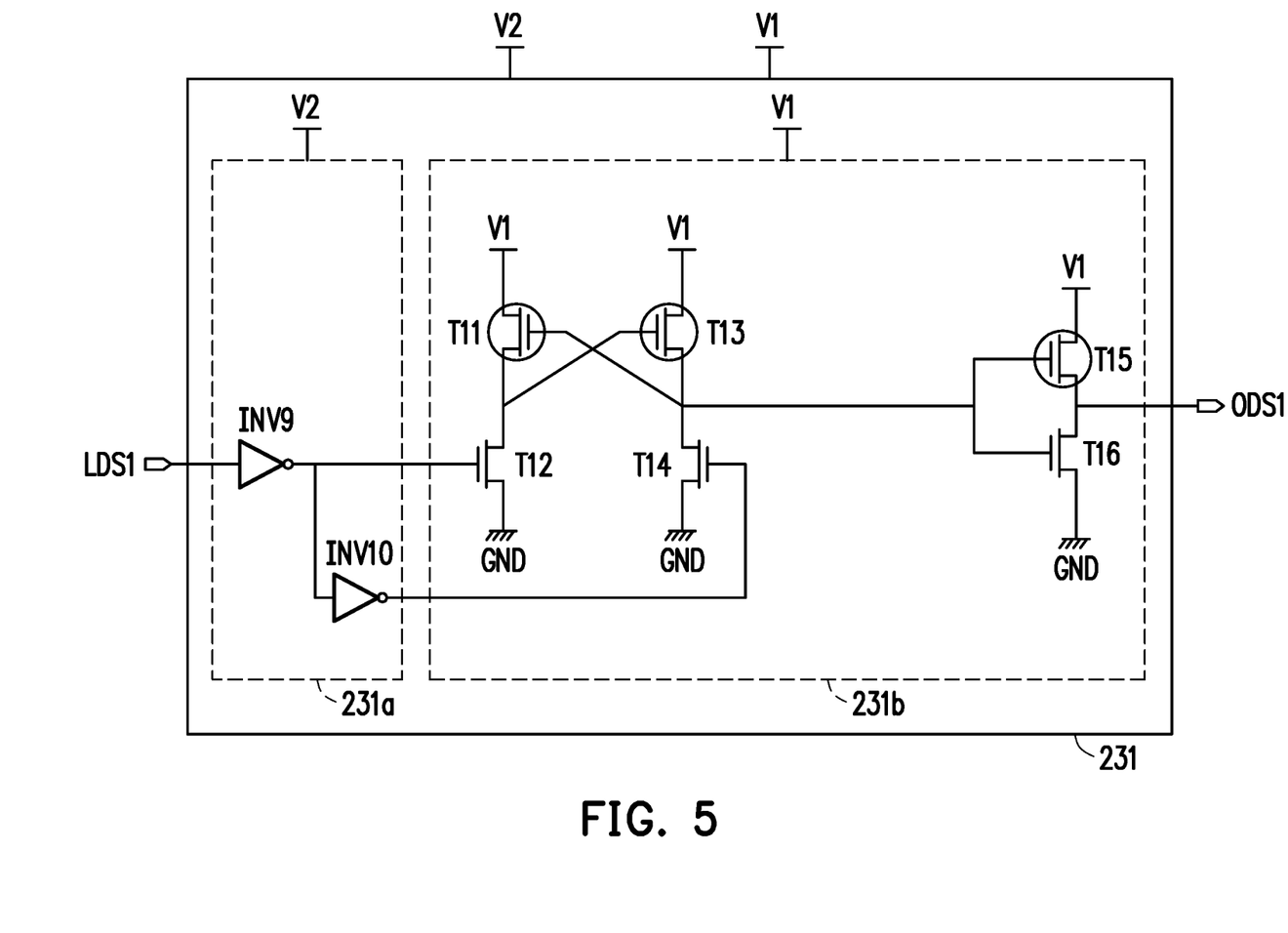
FIG. 5 is a schematic diagram illustrating an internal circuit structure of the voltage level shift circuit of FIG. 2 according to an embodiment of the disclosure.

Next, the internal circuit structures of the first voltage level shift circuit 231 and the second voltage level shift circuit 232 are described in detail as follows. For ease of description, similarly, only the internal circuit structure of the first voltage level shift circuit 231 is depicted, and the first voltage level shift circuit 231 is served as an exemplary example for illustration. With reference to FIG. 2 and FIG. 5 together, FIG. 5 is a schematic diagram illustrating an internal circuit structure of the voltage level shift circuit of FIG. 2 according to an embodiment of the disclosure. The first voltage level shift circuit 231 includes a first input circuit 231a and a first output setting circuit 231b. The first input circuit 231a is coupled to the first latch driving circuit 221 and receives the first latch data signal LDS1 by the second voltage V2. The first output setting circuit 231b is coupled to the first input circuit 231a and generates the first output data signal ODS1 by the first latch data signal LDS1. Herein, the first output setting circuit 231b sets the voltage value of the first output data signal ODS1 by the first voltage V1.

Further, the first input circuit 231a of this embodiment includes inverters INV9 and INV10. An input terminal of the inverter INV9 is coupled to the first latch driving circuit 221 and receives the first latch data signal LDS1, and an output terminal of the inverter INV9 is coupled to the first output setting circuit 231b. An input terminal of the inverter INV10 is coupled to the output terminal of the inverter INV9, and an output terminal of the inverter INV10 is coupled to the first output setting circuit 231b.

From another perspective, the first output setting circuit 231b includes transistors T11, T12, T13, T14, T15 and T16. A first terminal of the transistor T11 receives the first voltage V1, a control terminal of the transistor T11 is coupled to a first terminal of the transistor T14, and a second terminal of the transistor T11 is coupled to a control terminal of the transistor T13. A first terminal of the transistor T12 is coupled to the second terminal of the transistor T11, a control terminal of the transistor T12 is coupled to the output terminal of the inverter INV9 in the first input circuit 231a, and a second terminal of the transistor T12 receives the grounding voltage GND. A first terminal of the transistor T13 receives the first voltage V1, the control terminal of the transistor T13 is coupled to the second terminal of the transistor T11, and a second terminal of the transistor T13 is coupled to the control terminal of the transistor T11. The first terminal of the transistor T14 is coupled to the second terminal of the transistor T13, a control terminal of the transistor T14 is coupled to the output terminal of the inverter INV10 in the first input circuit 231a, and a second terminal of the transistor T14 receives the grounding voltage GND. A first terminal of the transistor T15 receives the first voltage V1, a control terminal of the transistor T15 is coupled to the second terminal of the transistor T13, and a second terminal of the transistor T15 is coupled to a first terminal of the transistor T16 and outputs the first output data signal ODS1. The first terminal of the transistor T16 is coupled to the second terminal of the transistor T15, a control terminal of the transistor T16 is coupled to the control terminal of the transistor T15, and a second terminal of the transistor T16 receives the grounding voltage GND.

In addition, note that the internal circuit structure of the second voltage level shift circuit 232 of this embodiment is similar to the internal circuit structure of the first voltage level shift circuit 231. Hence, people having ordinary skill in the art may implement the internal circuit structure of the second voltage level shift circuit 232 of this embodiment according to description of the implementation related to the first voltage level shift circuit 231, and repeated description is not provided herein.

As described above, in this embodiment, the data receiver 210 works in the first voltage V1 of a greater voltage value, so that the operating speed of the memory device 200 is increased. Moreover, in the latch driver 220, the first voltage V1 and the second voltage V2 having different voltage values are respectively provided to the latch circuits and the driving circuits in the first latch driving circuit 221 and the second latch driving circuit 222, so as to drive motions of the circuits based on levels. Further, in the voltage level shifter 230, the first voltage V1 and the second voltage V2 having different voltage values are respectively provided to the input circuits and the output setting circuits of the first voltage level shift circuit 231 and the second voltage level shift circuit 232, so as to drive motions of the circuits based on levels. In this way, power consumption of the memory device 200 is decreased.

In view of the foregoing, in the embodiments of the disclosure, the first voltage having a greater voltage value is used to drive the data receiver, so as to increase the operating speed of the memory device. Further, the first voltage is used to drive the latch driver to latch the internal data signal, and the second voltage having a lower voltage value is then used to drive the latch driver to output the at least one latch data signal. Next, the second voltage is used to drive the voltage level shifter to receive the at least one latch data signal, and the first voltage is then used to drive the voltage level shifter to output the at least one output data signal. In this way, driving is performed based on levels, so as to lower power consumption of the memory device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

INDUSTRIAL APPLICABILITY

In the disclosure, the first voltage and the second voltage having two different voltage values are used to drive the data receiver, the latch driver, and the voltage level shifter in the memory device, so as to perform different operations according to the first voltage and the second voltage. In this way, the operating speed of the memory device is increased, and the memory device achieves low power consumption performance.

What is claimed is:

1. A memory device, comprising:
a data receiver, working in a first voltage, configured to receive an enable signal, a reference signal, and an input data signal, outputting an internal data signal by the first voltage;
a latch driver, coupled to the data receiver, configured to receive a write select signal and the internal data signal, latching the internal data signal by the first voltage, outputting at least one latch data signal by a second voltage, wherein the latch driver comprises:
    a first latch driving circuit, coupled to the data receiver, receiving the write select signal, and the internal data signal, latching the internal data signal by the first voltage, outputting a first latch data signal of the at least one latch data signal by the second voltage; and
    a second latch driving circuit, coupled to the data receiver, receiving the write select signal, and the internal data signal, latching the internal data signal by the first voltage, outputting a second latch data signal of the at least one latch data signal by the second voltage; and
a voltage level shifter, coupled to the latch driver, receiving the at least one latch data signal by the second voltage, generating at least one output data signal by the at least one latch data signal, wherein the voltage level shifter sets a voltage value of the at least one output data signal by the first voltage,
wherein the voltage value of the first voltage is greater than the voltage value of the second voltage.

2. The memory device as claimed in claim 1, wherein the latch driver further receives a reset signal to perform a reset operation.

3. The memory device as claimed in claim 2, wherein the data receiver comprises:
a first transistor, a first terminal of the first transistor receiving the first voltage, a control terminal of the first transistor receiving the enable signal;
a second transistor, a first terminal of the second transistor coupled to a second terminal of the first transistor, a control terminal of the second transistor receiving the reference signal;0
a third transistor, a first terminal of the third transistor coupled to a second terminal of the second transistor, a control terminal of the third transistor coupled to the first terminal of the third transistor, a second terminal of the third transistor receiving a grounding voltage;
a fourth transistor, a first terminal of the fourth transistor coupled to the second terminal of the first transistor, a control terminal of the fourth transistor receiving the input data signal;
a fifth transistor, a first terminal of the fifth transistor coupled to a second terminal of the fourth transistor, a control terminal of the fifth transistor coupled to the control terminal of the third transistor, a second terminal of the fifth transistor receiving the grounding voltage;
a sixth transistor, a first terminal of the sixth transistor coupled to the first terminal of the fifth transistor, a control terminal of the sixth transistor receiving the enable signal, a second terminal of the sixth transistor receiving the grounding voltage; and
an inverting circuit, coupled to the first terminal of the sixth transistor, configured to output the internal data signal.

4. The memory device as claimed in claim 3, wherein the inverting circuit comprises:
a seventh transistor, a first terminal of the seventh transistor receiving the first voltage, a control terminal of the seventh transistor coupled to the first terminal of the sixth transistor, a second terminal of the seventh transistor outputting the internal data signal; and
an eighth transistor, a first terminal of the eighth transistor coupled to the second terminal of the seventh transistor, a control terminal of the eighth transistor coupled to the control terminal of the seventh transistor, a second terminal of the eighth transistor receiving the grounding voltage.

5. The memory device as claimed in claim 2, wherein
the first latch driving circuit is further configured to receive the reset signal, and
the second latch driving circuit is further configured to receive the reset signal.

6. The memory device as claimed in claim 5, wherein the first latch data signal is an odd channel signal, and the second latch data signal is an even channel signal.

7. The memory device as claimed in claim 5, wherein each of the first latch driving circuit and the second latch driving circuit comprises:
a latch circuit, coupled to the data receiver, receiving the reset signal, the write select signal, and the internal data signal, latching the internal data signal by the first voltage; and
a driving circuit, coupled to the latch circuit,
    wherein the driving circuit of the first latch driving circuit outputs the first latch data signal by the second voltage, and
    wherein the driving circuit of the second latch driving circuit outputs the second latch data signal by the second voltage.

8. The memory device as claimed in claim 7, wherein each of the latch circuit of the first latch driving circuit and the latch circuit of the second latch driving circuit comprises:

a first transfer gate, receiving an inverted internal data signal, controlled by an inverted write select signal to be turned on or turned off;

a first latch, coupled to the first transfer gate, configured to latch the inverting internal data signal;

a second transfer gate, coupled to the first latch, configured to receive a signal of the first latch, controlled by the inverted write select signal to be turned on or turned off; and a second latch, coupled to the second transfer gate, configured to latch the signal in the first latch and an inverted reset signal.

9. The memory device as claimed in claim 8, wherein each of the first latch of the latch circuit of the first latch driving circuit and the first latch of the latch circuit of the second latch driving circuit comprises:

a first inverter, an input terminal of the first inverter coupled to an output terminal of the first transfer gate, an output terminal of the first inverter coupled to an input terminal of the second transfer gate; and a second inverter, an input terminal of the second inverter coupled to the output terminal of the first inverter, an output terminal of the second inverter coupled to the input terminal of the first inverter, wherein each of the second latch of the latch circuit of the first latch driving circuit and the second latch of the latch circuit of the second latch driving circuit comprises:

a first NAND gate, a first terminal of the first NAND gate coupled to an output terminal of the second transfer gate, a second terminal of the first NAND gate receiving the inverting reset signal; and a third inverter, an input terminal of the third inverter coupled to an output terminal of the first NAND gate, an output terminal of the third inverter coupled to the first terminal of the first NAND gate.

10. The memory device as claimed in claim 9, wherein each of the latch circuit of the first latch driving circuit and the latch circuit of the second latch driving circuit further comprises:

a fourth inverter, an input terminal of the fourth inverter coupled to an output terminal of the second latch, an output terminal of the fourth inverter coupled to the driving circuit.

11. The memory device as claimed in claim 7, wherein each of the driving circuit of the first latch driving circuit and the driving circuit of the second latch driving circuit comprises:

a first transistor, a first terminal of the first transistor receiving the second voltage, a control terminal of the first transistor coupled to the latch circuit; and a second transistor, a first terminal of the second transistor coupled to a second terminal of the first transistor, a control terminal of the second transistor coupled to the latch circuit, a second terminal of the second transistor receiving the grounding voltage, wherein the second terminal of the first transistor of the driving circuit of the first latch driving circuit outputs the first latch data signal, and wherein the second terminal of the first transistor of the driving circuit of the second latch driving circuit outputs the second latch data signal.

12. The memory device as claimed in claim 11, wherein the first transistor of the driving circuit of the first latch driving circuit and the first transistor of the driving circuit of the second latch driving circuit are P-type or N-type transistors, and the second transistor of the driving circuit of the first latch driving circuit and the second transistor of the driving circuit of the second latch driving circuit are N-type transistors.

13. The memory device as claimed in claim 5, wherein the voltage level shifter comprises:

a first voltage level shift circuit, coupled to the first latch driving circuit, receiving the first latch data signal by the second voltage, generating a first output data signal in the at least one output data signal by the first latch data signal, wherein the first voltage level shift circuit sets the voltage value of the first output data signal by the first voltage; and a second voltage level shift circuit, coupled to the second latch driving circuit, receiving the second latch data signal by the second voltage, generating a second output data signal in the at least one output data signal by the second latch data signal, wherein the second voltage level shift circuit sets the voltage value of the second output data signal by the first voltage.

14. The memory device as claimed in claim 13, wherein the first voltage level shift circuit comprises:

a first input circuit, coupled to the first latch driving circuit, receiving the first latch data signal by the second voltage; and a first output setting circuit, coupled to the first input circuit, generating the first output data signal by the first latch data signal, wherein the first output setting circuit sets the voltage value of the first output data signal by the first voltage, wherein the second voltage level shift circuit comprises:

a second input circuit, coupled to the second latch driving circuit, receiving the second latch data signal by the second voltage; and a second output setting circuit, coupled to the second input circuit, generating the second output data signal by the second latch data signal, wherein the second output setting circuit sets the voltage value of the second output data signal by the first voltage.

15. The memory device as claimed in claim 14, wherein each of the first input circuit and the second input circuit comprises:

a first inverter and a second inverter, an input terminal of the second inverter and an output terminal of the first inverter being coupled to each other, wherein an input terminal of the first inverter of the first input circuit receives the first latch data signal, the output terminal of the first inverter of the first input circuit and an output terminal of the second inverter of the first input circuit being coupled to the first output setting circuit, and wherein an input terminal of the first inverter of the second input circuit receives the second latch data signal, and the output terminal of the first inverter of the second input circuit and an output terminal of the second inverter of the second input circuit are coupled to the second output setting circuit.

16. The memory device as claimed in claim 15, wherein each of the first output setting circuit and the second output setting circuit comprises:

a first transistor, a first terminal of the first transistor receiving the first voltage;

a second transistor, a first terminal of the second transistor coupled to a second terminal of the first transistor, a second terminal of the second transistor receiving the grounding voltage;

a third transistor, a first terminal of the third transistor receiving the first voltage, a control terminal of the third transistor coupled to the second terminal of the first transistor, a second terminal of the third transistor coupled to a control terminal of the first transistor;

a fourth transistor, a first terminal of the fourth transistor coupled to the second terminal of the third transistor, a second terminal of the fourth transistor receiving the grounding voltage;

a fifth transistor, a first terminal of the fifth transistor receiving the first voltage, a control terminal of the fifth transistor coupled to the second terminal of the third transistor; and a sixth transistor, a first terminal of the sixth transistor coupled to a second terminal of the fifth transistor, a control terminal of the sixth transistor coupled to the control terminal of the fifth transistor, a second terminal of the sixth transistor receiving the grounding voltage, wherein a control terminal of the second transistor of the first output setting circuit and a control terminal of the fourth transistor of the first output setting circuit are coupled to the first input circuit, and the second terminal of the fifth transistor of the first output setting circuit generates the first output data signal, and wherein a control terminal of the second transistor of the second output setting circuit and a control terminal of the fourth transistor of the second output setting circuit are coupled to the second input circuit, and the second terminal of the fifth transistor of the second output setting circuit generates the second output data signal.

* * * * *